US009455198B1

United States Patent
Yu et al.

(10) Patent No.: US 9,455,198 B1
(45) Date of Patent: Sep. 27, 2016

(54) METHODS OF REMOVING FINS SO AS TO FORM ISOLATION STRUCTURES ON PRODUCTS THAT INCLUDE FINFET SEMICONDUCTOR DEVICES

(71) Applicant: GLOBALFOUNDRIES Inc., Grand Cayman (KY)

(72) Inventors: Hong Yu, Rexford, NY (US); HongLiang Shen, Ballston Lake, NY (US); Zhenyu Hu, Clifton Park, NY (US); Lun Zhao, Ballston Lake, NY (US); Richard J. Carter, Saratoga Springs, NY (US); Xusheng Wu, Ballston Lake, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/676,034

(22) Filed: Apr. 1, 2015

Related U.S. Application Data (60) Provisional application No. 62/088,900, filed on Dec. 8, 2014.

(51) Int. Cl.
*H01L 21/8234* (2006.01)
*H01L 21/308* (2006.01)

(52) U.S. Cl.
CPC ... *H01L 21/823481* (2013.01); *H01L 21/3086* (2013.01); *H01L 21/823431* (2013.01)

(58) Field of Classification Search
CPC .................. H01L 21/823481; H01L 21/3086; H01L 21/823431
See application file for complete search history.

(56) References Cited

U.S. PATENT DOCUMENTS 8,753,940 B1 * 6/2014 Wei ................... H01L 21/82343
257/E21.429

* cited by examiner

*Primary Examiner* — Mamadou Diallo
(74) *Attorney, Agent, or Firm* — Amerson Law Firm, PLLC

(57) ABSTRACT

One illustrative method disclosed herein includes, among other things, removing at least one, but not all, of a plurality of first features in a first patterned mask layer so as to define a modified first patterned masking layer, wherein removed first feature(s) correspond to a location where a final isolation structure will be formed, performing an etching process though the modified first patterned masking layer to form an initial isolation trench in the substrate, and performing another etching process through the modified first patterned mask layer to thereby define a plurality of fin-formation trenches in the substrate and to extend a depth of the initial isolation trench so as to define a final isolation trench for the final isolation structure.

20 Claims, 10 Drawing Sheets

METHODS OF REMOVING FINS SO AS TO FORM ISOLATION STRUCTURES ON PRODUCTS THAT INCLUDE FINFET SEMICONDUCTOR DEVICES

BACKGROUND OF THE INVENTION

1. Field of the Invention

Generally, the present disclosure relates to the manufacture of semiconductor devices, and, more specifically, to various methods of removing fins so as to form isolation structures on products that include FinFET semiconductor devices.

2. Description of the Related Art

In modern integrated circuit products, such as microprocessors, storage devices and the like, a very large number of circuit elements, especially transistors, are formed on a restricted chip area. In integrated circuits fabricated using metal-oxide-semiconductor (MOS) technology, field effect transistors (FETs) (both NMOS and PMOS transistors) are provided that are typically operated in a switching mode. That is, these transistor devices exhibit a highly conductive state (ON-state) and a high impedance state (OFF-state). FETs may take a variety of forms and configurations. For example, among other configurations, FETs may be either so-called planar FET devices or three-dimensional (3D) devices, such as FinFET devices.

A field effect transistor (FET), irrespective of whether an NMOS transistor or a PMOS transistor is considered, and irrespective of whether it is a planar or 3D FinFET device, typically comprises a doped source region and a separate doped drain region that are formed in a semiconductor substrate. The source and drain regions are separated by a channel region. A gate insulation layer is positioned above the channel region and a conductive gate electrode is positioned above the gate insulation layer. The gate insulation layer and the gate electrode may sometimes be referred to as the gate structure of the device. By applying an appropriate voltage to the gate electrode, the channel region becomes conductive and current is allowed to flow from the source region to the drain region. The gate structures for such FET devices may be manufactured using so-called "gate-first" or "replacement gate" (gate-last) manufacturing techniques.

Figure 1A:
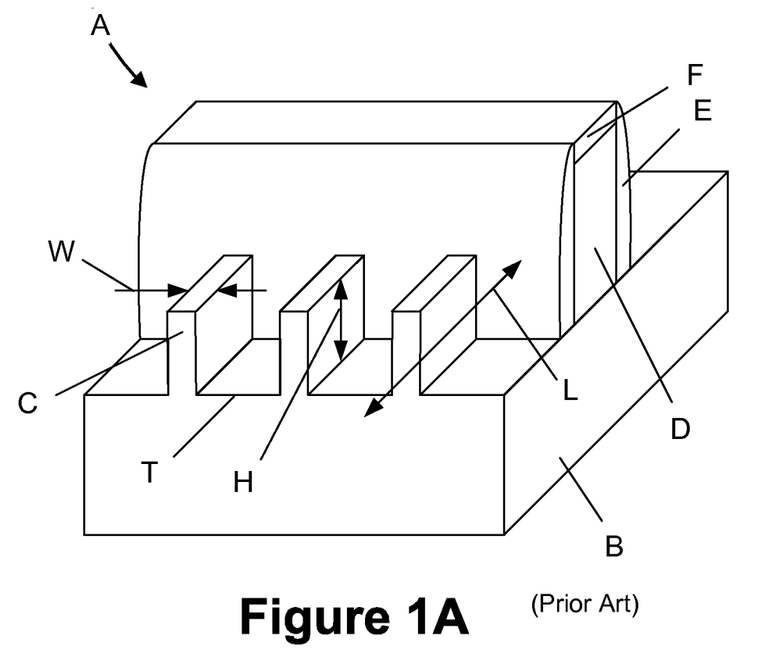
FIG. 1A is a perspective view of one illustrative embodiment of a prior art FinFET device.

In contrast to a FET, which has a planar structure, a so-called FinFET device has a three-dimensional (3D) structure. FIG. 1A is a perspective view of an illustrative prior art FinFET semiconductor device "A" that is formed above a semiconductor substrate B that will be referenced so as to explain, at a very high level, some basic features of a FinFET device. In this example, the FinFET device A includes three illustrative fins C, a gate structure D, sidewall spacers E and a gate cap layer F. Trenches T are formed in the substrate B to define the fins C. The gate structure D is typically comprised of a layer of gate insulating material (not separately shown), e.g., a layer of high-k insulating material (k-value of 10 or greater) or silicon dioxide, and one or more conductive material layers (e.g., metal and/or polysilicon) that serve as the gate electrode for the device A. The fins C have a three-dimensional configuration: a height H, a width W and an axial length L. The axial length L corresponds to the direction of current travel in the device A when it is operational. The portions of the fins C covered by the gate structure D are the channel regions of the FinFET device A. In a conventional process flow, the portions of the fins C that are positioned outside of the spacers E, i.e., in the source/drain regions of the device A, may be increased in size or even merged together (a situation not shown in FIG. 1A) by performing one or more epitaxial growth processes to grow epitaxial semiconductor material in the source/drain regions. When an appropriate voltage is applied to the gate electrode of a FinFET device, the surfaces (and the inner portion near the surface) of the fins C, i.e., the vertically oriented sidewalls and the top upper surface of the fin, form a surface inversion layer or a volume inversion layer that contributes to current conduction.

FETs, including FinFET transistor devices, have an isolation structure, e.g., a shallow trench isolation structure that is formed in the semiconducting substrate around the device so as to electrically isolate the transistor from adjacent transistors. Traditionally, isolation structures were always the first structures that were formed when manufacturing semiconductor devices. The isolation structures were formed by etching the trenches for the isolation structures and thereafter filling the trenches with the desired insulating material, e.g., silicon dioxide. After the isolation structures were formed, various process operations were performed to manufacture the semiconductor device. In the case of a FinFET device, this involved masking the previously formed isolation structure and etching the trenches in the substrate that defined the fins. As FinFET devices have been scaled, i.e., reduced in size, to meet ever increasing performance and size requirements, the width W of the fins C has become very small, e.g., 6-12 nm, and the fin pitch has also been significantly decreased, e.g., the fin pitch may be on the order of about 30-60 nm.

As the dimensions of the fins became smaller, problems arose with manufacturing the isolation structures before the fins were formed. As one example, trying to accurately define very small fins in regions that were separated by relatively large isolation regions was difficult due to the non-uniform spacing between various structures on the substrate. One manufacturing technique that is employed in manufacturing FinFET devices is to initially form the trenches T in the substrate B to define multiple "fins" (i.e., a "sea of fins") that extend across the substrate, and thereafter remove some of the fins C where larger isolation structures will be formed. Using this type of manufacturing approach, better accuracy and repeatability may be achieved in forming the fins C to very small dimensions due to the more uniform environment in which the etching process that forms the trenches T is performed.

Figure 1B:
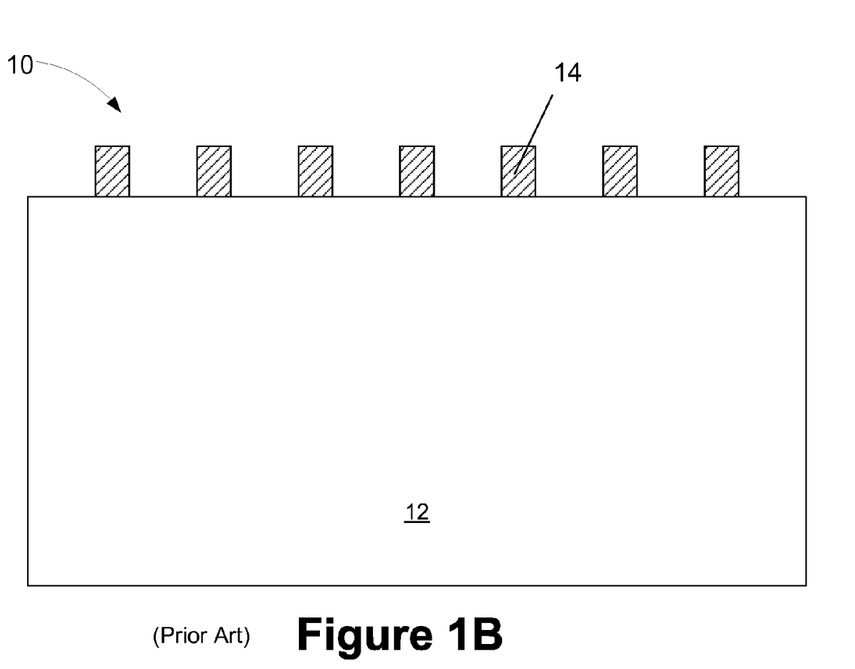
FIGS. 1B-1I depict illustrative prior art methods of removing selected fin structures and forming isolation structures on products that include FinFET semiconductor devices.

FIGS. 1B-1I depict one illustrative prior art process, a so-called "Fins-cut-First" process, of forming fins and isolation structures on a product comprised of a plurality of FinFET devices. Accordingly, FIG. 1B depicts the device 10 after a patterned hard mask layer 14, e.g., a patterned layer of silicon nitride (pad nitride) along with a patterned layer of silicon dioxide (pad oxide), was formed above the substrate 12 in accordance with the desired fin pattern and pitch.

Figure 1C:
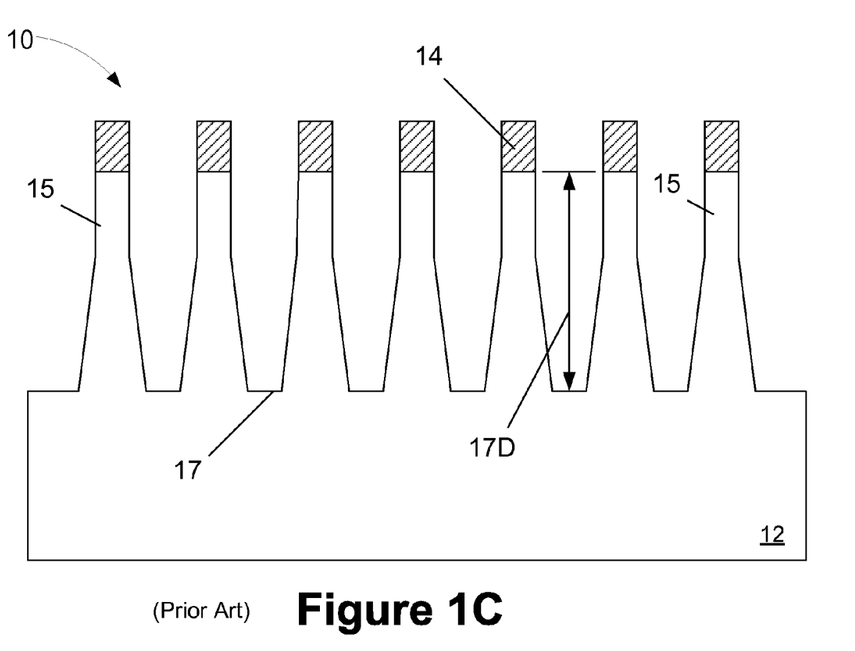

FIG. 1C depicts the device 10 after a fin-formation etching process was performed through the patterned masking layer 14 so as to define a plurality of trenches 17 in the substrate 12 that define the fins 15. The trenches 17 are formed to a depth 17D, which in some applications may be on the order of about 140-150 nm.

Figure 1D:
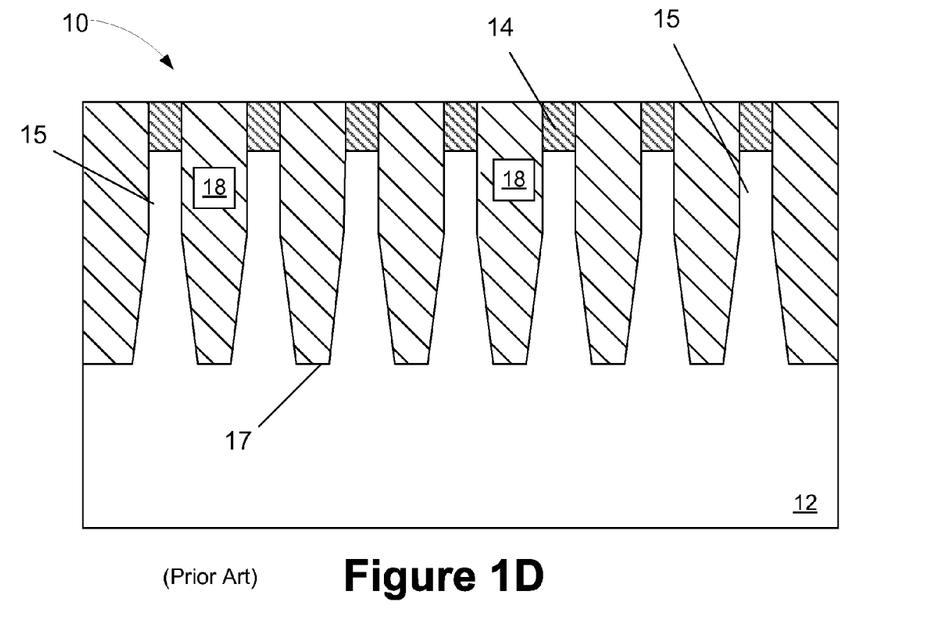

FIG. 1D depicts the device 10 after a layer of insulating material 18, such as flowable silicon dioxide (FCVD), was formed so as to overfill the trenches 17. The FCVD material may be selected so as to insure substantially complete filling of the relatively narrow and deep trenches 17, i.e., high aspect ratio trenches. One downside to the use of the FCVD material is that it is a relatively slow process that increases production time. A chemical mechanical polishing (CMP)

process was then performed to planarize the upper surface of the insulating material 18 with the top of the patterned hard mask 14.

Figure 1E:
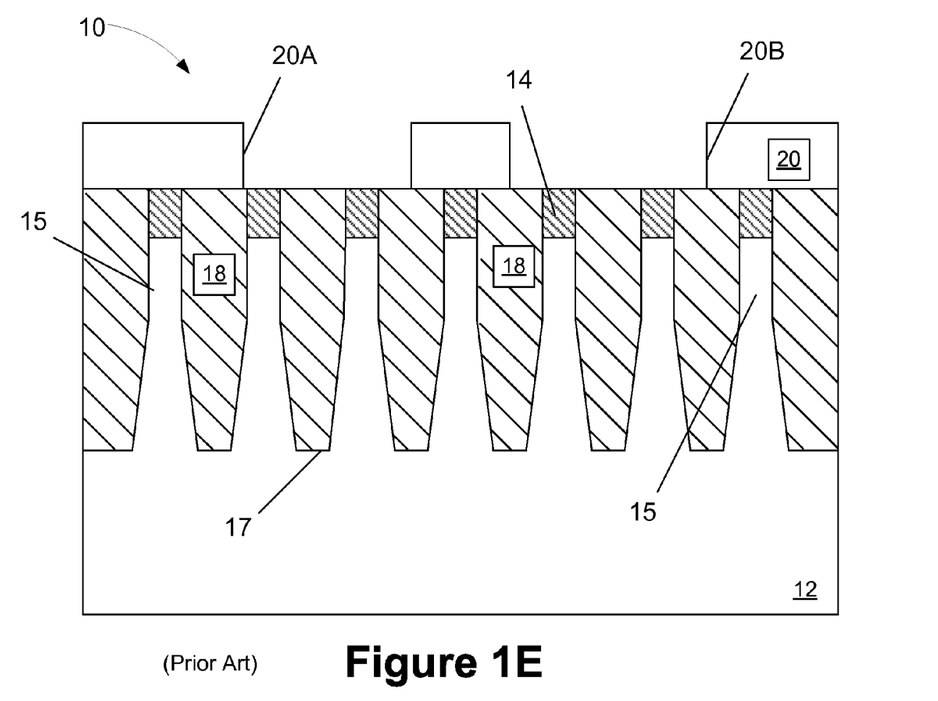

FIG. 1E depicts the device 10 after a patterned masking layer 20, e.g., a patterned layer of photoresist, was formed above the patterned hard mask layer 14 and the layer of insulating material 18. The patterned masking layer 20 has openings 20A, 20B that are positioned above the fins 15 to be removed to make room for the isolation structure. In this example, two fins will be removed to make room for the isolation structures. Of course, any number of fins may be removed. The opening 20A is depicted as being slightly misaligned.

Figure 1F:
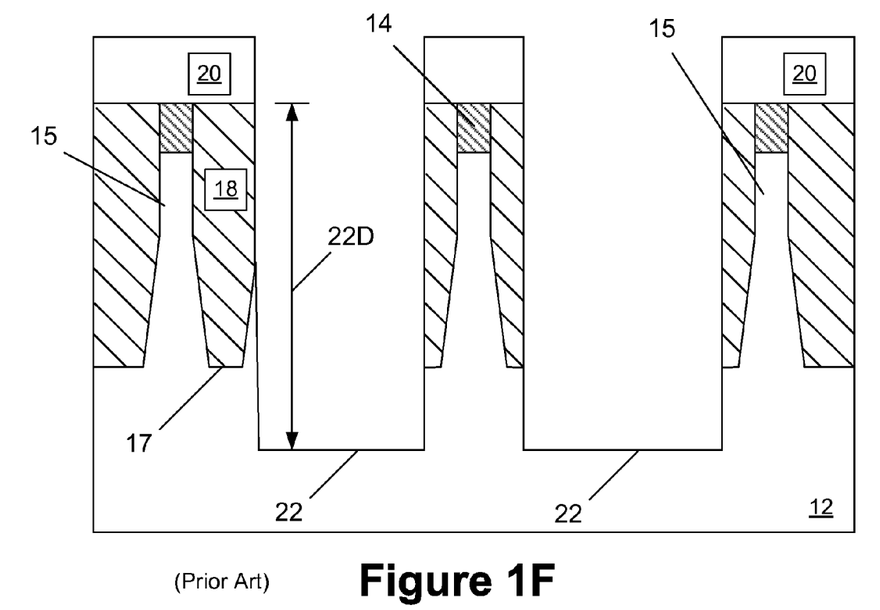

FIG. 1F depicts the device 10 after an isolation-trench etching process was performed through the patterned masking layer 20 so as to define a plurality of trenches 22 in the substrate 12 that define the area where isolation structures will be formed. As depicted, the trenches 22 are deeper than the trenches 17. In one embodiment, the trenches 22 are formed to a depth 22D, which in some applications may be on the order of about 250 nm.

Figure 1G:
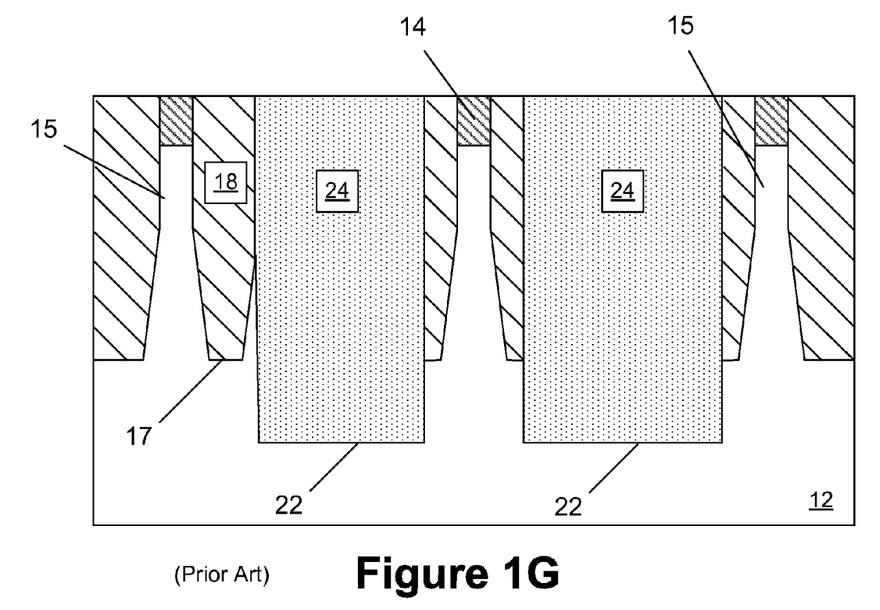

FIG. 1G depicts the product after several process operations were performed. First, another layer of insulating material 24, such as silicon dioxide formed by the well-known HARP process, was formed so as to overfill the trenches 22. The HARP process may be employed to fill the relatively wider trenches 22 because it is a faster process, thereby tending to increase production rates. After the deposition of the layer of insulating material 24, an anneal process may be performed to densify the various insulating materials. Then, a chemical mechanical polishing (CMP) process was performed to planarize the upper surface of the insulating material 24 with the top of the patterned hard mask 14.

Figure 1H:
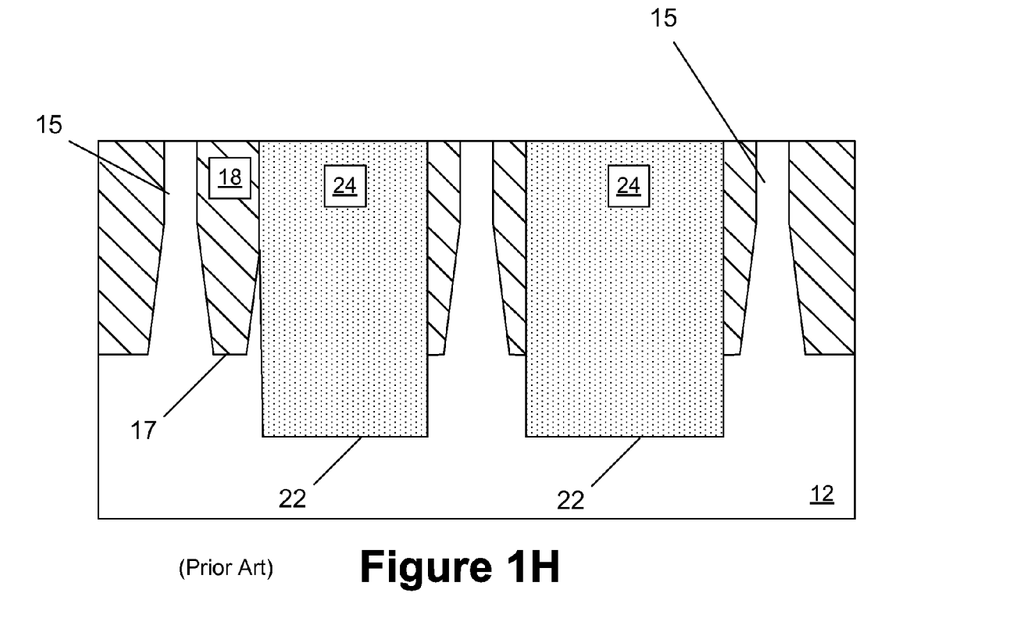

FIG. 1H depicts the device 10 after the patterned hard mask layer 14 was removed (SiN strip followed by oxide deglaze).

Figure 1I:
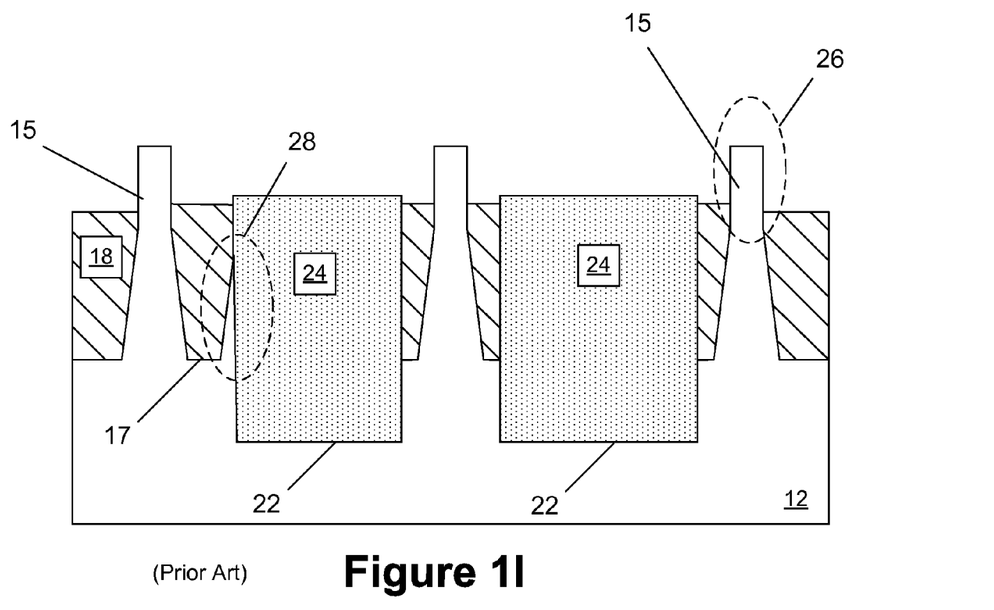

FIG. 1I depicts the device 10 after an etch-back process was performed to recess the layers of insulating material 18, 24 between the fins 15 and thereby expose the upper portions of the fins 15, which corresponds to the final fin height of the fins 15. Unfortunately, due to the different etching characteristic of the insulating materials 18, 24, the recessed upper surface of the insulating materials 18, 24 is not level or uniform. Such a situation can result in several problems. For example, such an uneven surface may result in fins having an asymmetric profile, as indicated in the dashed-line region 26. That is, the height of the exposed sides of the fin may be significantly different, e.g., 6 nm or so. As a result of the asymmetric profile, epitaxial semiconductor material (not shown) formed in the source/drain regions on such asymmetric fins will not be uniform in nature, thereby creating additional downstream processing issues. Another problem that may arise using this prior art process is that some fins may only be partially removed, as depicted in the dashed-line region 28. Such a situation may occur to misalignment of the fin-cut mask 20. The presence of such partial fins may be problematic in that, depending upon the size and location of such partial fins, epi semiconductor material may undesirably form on such partial fins.

The present disclosure is directed to various methods of removing fins so as to form isolation structures on products that include FinFET semiconductor devices that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of removing fins so as to form isolation structures on products that include FinFET semiconductor devices. One illustrative method disclosed herein includes, among other things, forming a first patterned masking layer comprised of a plurality of first features above a semiconductor substrate, removing at least one, but not all, of the first features so as to define a modified first patterned masking layer, wherein the at least one removed first feature is removed from above a location where a final isolation structure will be formed in the substrate, performing at least one first etching process though the modified first patterned masking layer to form an initial isolation trench in the substrate, and performing at least one second etching process through the modified first patterned mask layer to thereby define a plurality of fin-formation trenches in the substrate and to extend a depth of the initial isolation trench so as to define a final isolation trench for the final isolation structure, the final isolation trench having a final depth that is greater than a depth of the fin formation trenches, the fin-formation trenches defining a plurality of fins.

Another illustrative method disclosed herein includes, among other things, forming a first patterned masking layer comprised of a plurality of first features above a semiconductor substrate, forming a second patterned masking layer above the first patterned masking layer, the second patterned masking layer having an opening that exposes at least one, but not all, of the first features of the first patterned masking layer, performing at least one first etching process though the second patterned masking layer to remove the exposed at least one first feature and to form an initial isolation trench in the substrate, the at least one first etching process defining a modified first patterned mask layer, removing the second patterned mask layer from above the modified first patterned mask layer, and performing at least one second etching process through the modified first patterned mask layer to thereby define a plurality of fin-formation trenches in the substrate and to extend a depth of the initial isolation trench so as to define a final isolation trench having a final depth that is greater than a depth of the fin formation trenches, the fin-formation trenches defining a plurality of fins.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of removing fins so as to form isolation structures on products that include FinFET semiconductor devices. As will be readily apparent to those skilled in the art upon a complete reading of the present application, the methods disclosed herein may be employed in manufacturing a variety of different devices, including, but not limited to, logic products, memory products, etc. With reference to the attached figures, various illustrative embodiments of the methods and devices disclosed herein will now be described in more detail.

Figure 2A:
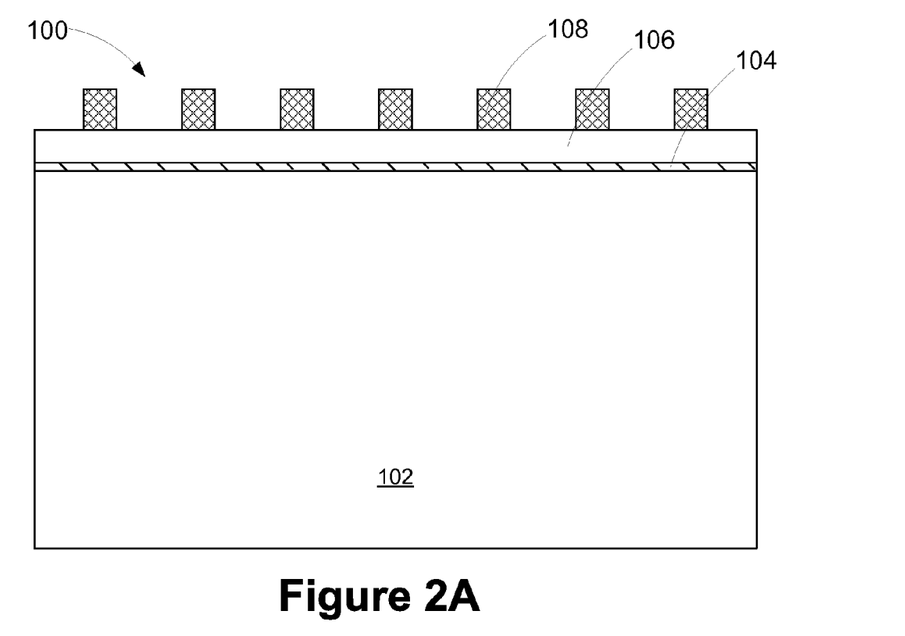
FIGS. 2A-2I depict various illustrative methods disclosed herein of removing fins so as to form isolation structures on products that include FinFET semiconductor devices.

FIG. 2A is a simplified view of an illustrative integrated circuit product 100 at an early stage of manufacturing. As will be recognized by those skilled in the art after a complete reading of the present application, the integrated circuit product 100 described herein may be comprised of N-type FinFET devices and/or P-type FinFET devices. In this illustrative embodiment, the substrate 102 has a bulk semiconducting material configuration. The substrate 102 may be made of silicon or it may be made of materials other than silicon. Thus, the terms "substrate" or "semiconducting substrate" should be understood to cover all forms of all semiconductor materials. Of course, the inventions disclosed herein should not be considered to be limited to the illustrative examples depicted and described herein. The various components and structures of the product 100 disclosed herein may be formed using a variety of different materials and by performing a variety of known techniques, e.g., a chemical vapor deposition (CVD) process, an atomic layer deposition (ALD) process, a thermal growth process, epi growth processes, spin-coating techniques, etc. The thicknesses of the various layers of material may also vary depending upon the particular application.

FIG. 2A depicts the product 100 after a layer of silicon dioxide (pad oxide) 104 and a layer of silicon nitride (pad nitride) 106 were formed above the substrate 102. Also depicted is an illustrative patterned masking layer 108, e.g., a patterned hard mask layer comprised of one or more materials that was formed above the layer 106. The composition of the illustrative patterned masking layer 108 is intended to be representative in nature, i.e., additional or fewer layers may be employed in the patterned masking layer 108. In one illustrative embodiment, the patterned masking layer 108 includes a stack of materials (oxide, amorphous silicon and nitride (from bottom to top)) formed above the layer 106. The pattern of the features in the patterned masking layer 108 corresponds to the desired pattern of fins to be formed in the substrate 102. The patterned masking layer 108 may be formed by depositing the layer(s) of material that comprise the masking layer 108 and thereafter directly patterning the masking layer 108 using known photolithography and etching techniques.

Alternatively, the patterned masking layer 108 may be formed by using known sidewall image transfer techniques. Thus, the particular form and composition of the patterned masking layer 108 and the manner in which it is made should not be considered a limitation of the present invention.

Figure 2B:
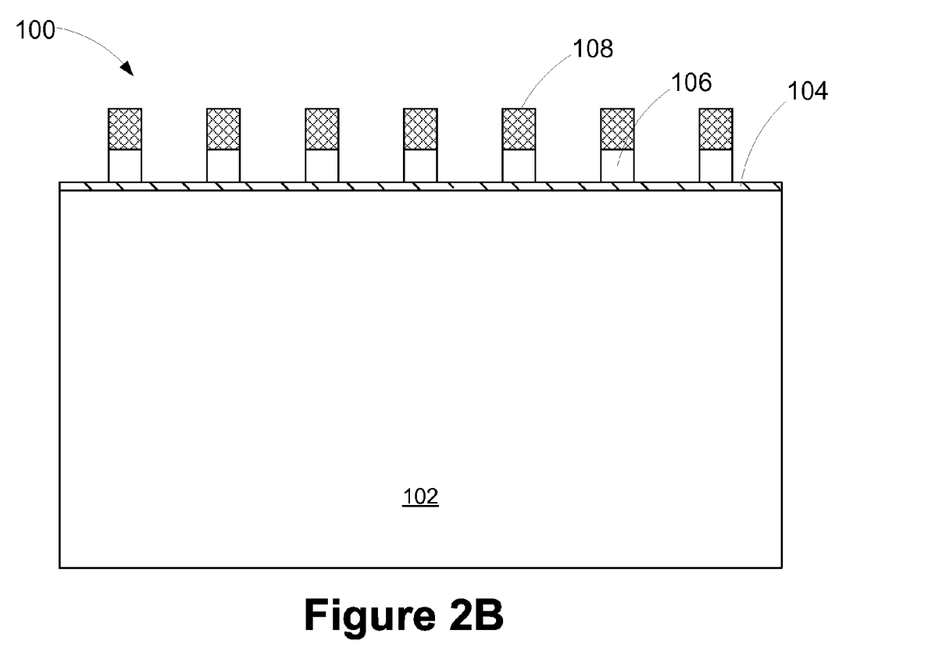

FIG. 2B depicts the product 100 after a first etching process was performed through the patterned masking layer 108 to pattern the layer 106 while stopping on the layer 104.

Figure 2C:
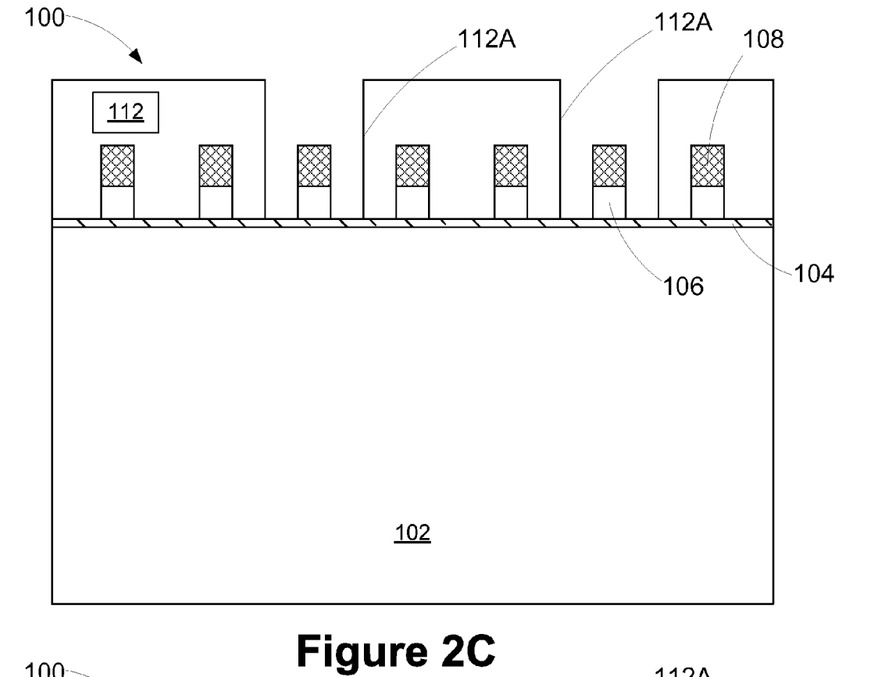

FIG. 2C depicts the product 100 after another patterned masking layer 112, e.g., a patterned layer of photoresist, a hard mask layer comprised of one or more materials, was formed above the substrate 102. The patterned masking layer 112 has a plurality of openings 112A that correspond to the location where isolation regions will be formed in the substrate 102. The composition of the illustrative patterned masking layer 112 is intended to be representative in nature, i.e., additional or fewer layers may be employed in the patterned masking layer 112. Thus, the particular form and composition of the patterned masking layer 112 and the manner in which it is made should not be considered a limitation of the present invention.

Figure 2D:
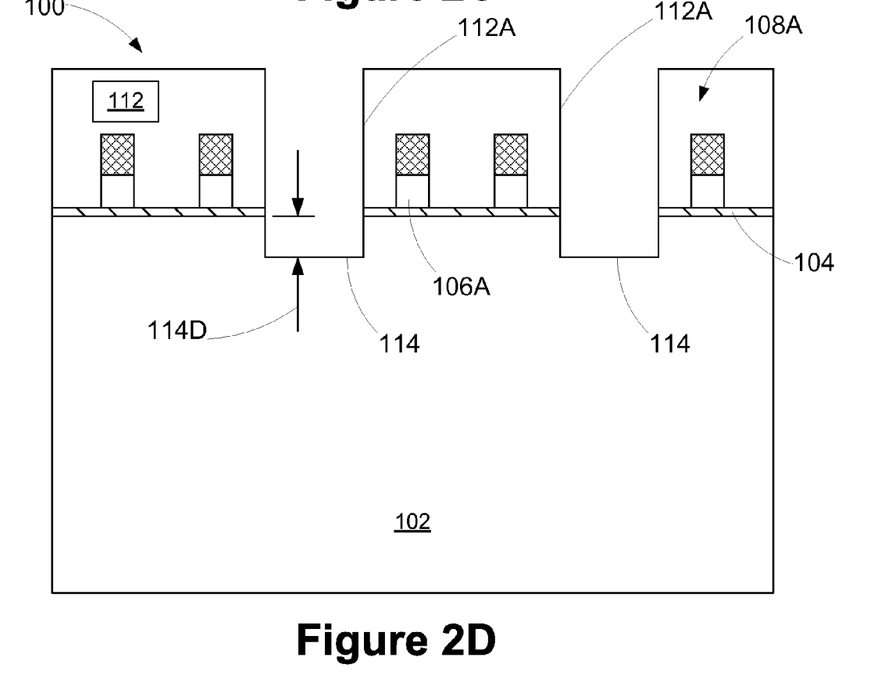

FIG. 2D depicts the product after one or more etching processes were performed through the patterned masking layer 112 to define a plurality of initial isolation trenches 114 in the substrate 102. The depth 114D of the initial isolation trenches 114 may vary depending upon the particular application, but they will be less than the depth of the final isolation trenches (discussed below) and shallower than the fin-formation trenches (discussed below). In one illustrative embodiment, where the depth of the final isolation trenches may be about 250 nm, the depth 114D of the initial isolation trenches 114 may be about 100 nm. The lateral width of the initial isolation trenches 114 may vary depending upon the final desired width of the final isolation trenches and the isolation structures formed therein. Note that this process operation results in the removal of some of the features of the patterned masking layer 108 and therefore results in the formation of a modified patterned masking layer 108A with fewer features than the original patterned masking layer 108. The etching process also results in the removal of some of the features of the original patterned pad nitride layer 106 (see FIG. 2B) and therefore results in the formation of a modified patterned pad nitride layer 106A with fewer features than the original patterned nitride layer 106.

Figure 2E:
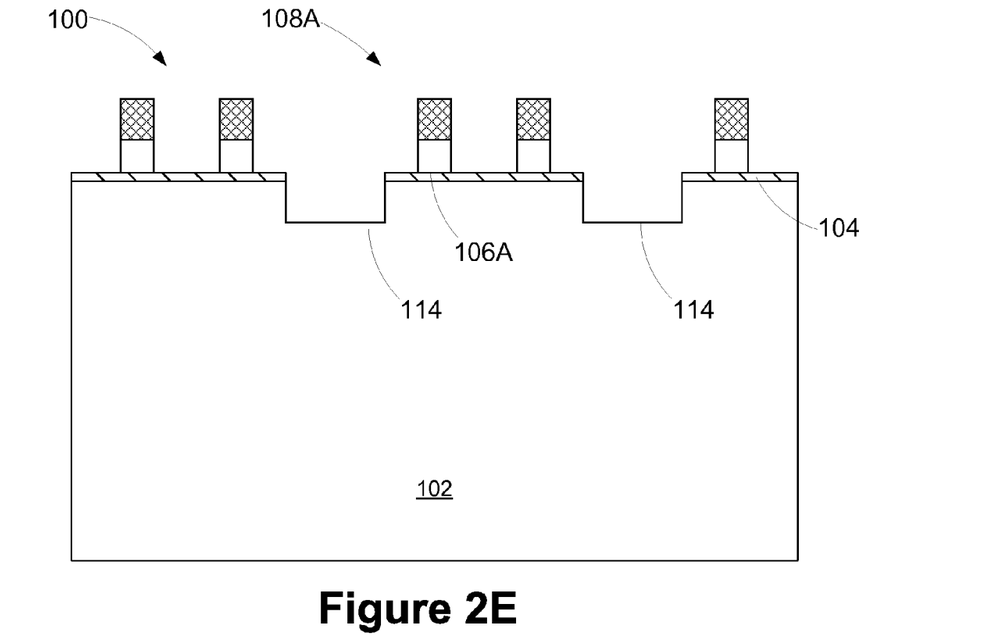

FIG. 2E depicts the product 100 after the patterned masking layer 112 was removed from the substrate 102.

Figure 2F:
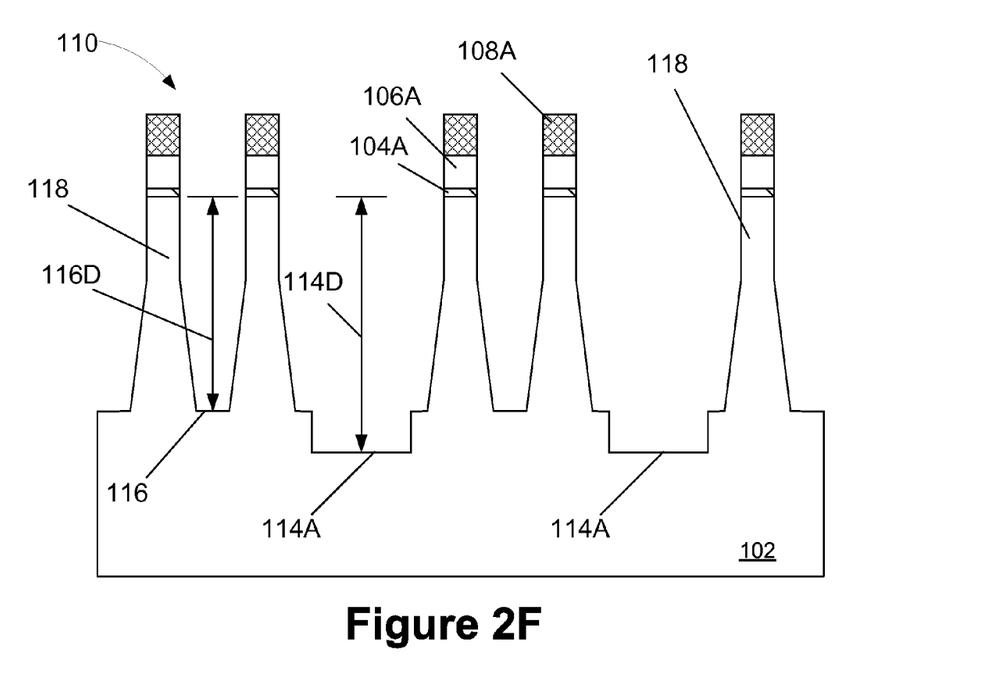

FIG. 2F depicts the product after a series of etching processes were performed through the modified patterned masking layer 108A and the modified patterned pad nitride layer 106A to ultimately define a plurality of fin-formation trenches 116 and a plurality of final isolation trenches 114A in the substrate 102. The formation of the fin-formation trenches 116 defines a plurality of fins 118. Initially, an etching process is performed to remove the exposed portions of the oxide layer 104 to define a patterned oxide layer 104A. Thereafter, the fin-formation trenches 116 and the final isolation trenches 114A were formed at the same time by performing a common etching process through the modified patterned masking layer 108A, the modified patterned pad nitride layer 106A and the patterned oxide layer 104A. The final isolation trenches 114A are deeper than the final isolation trenches 116 due to the previous formation of the initial isolation trenches 114. In effect, the etching process depicted in FIG. 2F extends the depth of the initial isolation trenches 114 to the final depth of the final isolation trenches 114A. In one illustrative embodiment, the fin-formation trenches 116 may have a depth 116D of about 140-150 nm, while the final isolation trenches 114A may have a depth 114D of about 250 nm Of course, the drawings herein are not to scale.

Figure 2G:
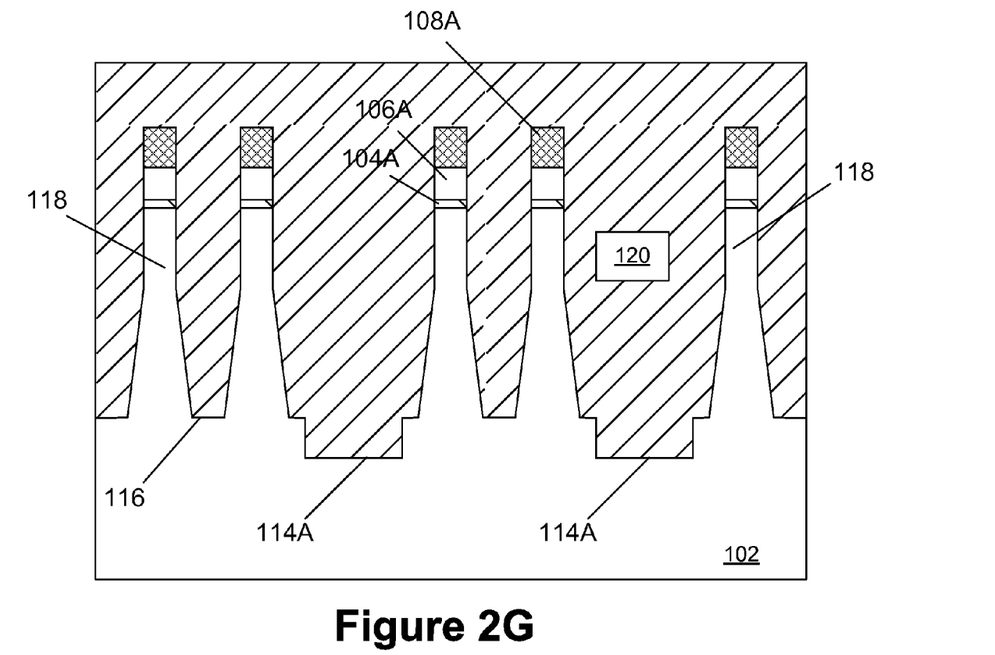

FIG. 2G depicts the product 100 after a layer of insulating material 120, such as silicon dioxide (FCVD), was formed so as to overfill the fin-formation trenches 116 and the final isolation trenches 114A.

Figure 2H:
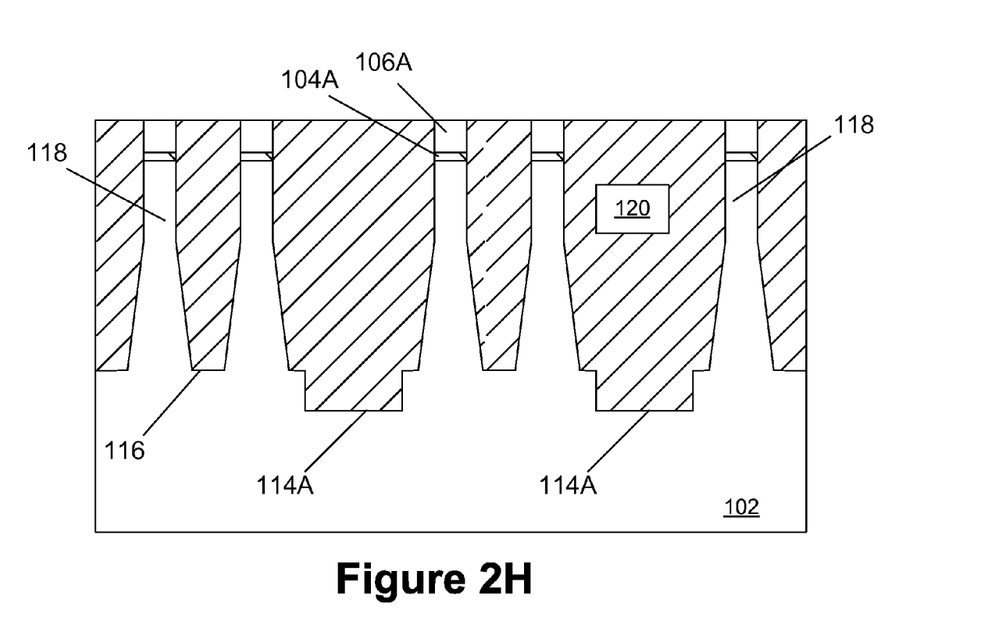

FIG. 2H depicts the product after a single chemical mechanical polishing (CMP) process was performed to planarize the upper surface of the insulating material 120 with the top of the modified patterned nitride layer 106A. As depicted, the modified patterned masking layer 108A is removed during this CMP process. Thus, unlike prior art processing techniques that involved performing at least two CMP processes (one to planarize the FCVD oxide material and one to planarize the HARP oxide material), the present invention provides a means to form the insulation material between the fins 118 as well as the insulation material for the isolation structure by performing a single CMP process operation. This means greater throughput, it produces a more uniform surface since only a single type of insulating material is polished and it results in a more uniform upper surface after the fin-reveal recess etching process is performed, as discussed more fully below.

Figure 2I:
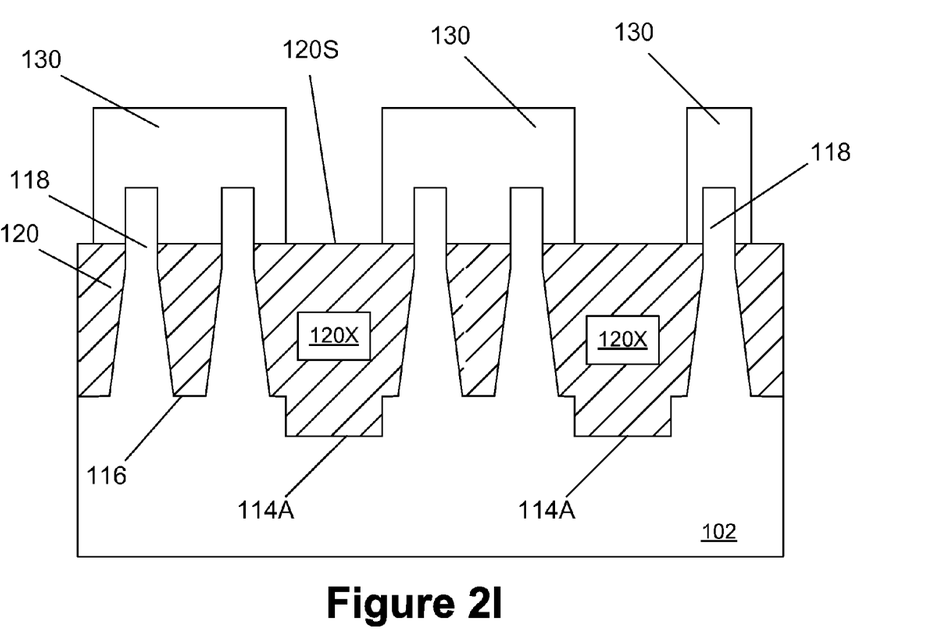

FIG. 2I depicts the product 100 after several process operations were performed. First, the modified patterned nitride layer 106A was removed by performing a nitride strip process. Thereafter, an oxide deglaze process was performed which removed the patterned pad oxide layer 104A. Then, a recesses etching process was performed to recess the layer of insulating material 120 between the fins 118 and thereby expose the upper portions of the fins 118 above the recessed upper surface 120S of the layer of insulating material 120, which corresponds to the final fin height of the fins 118. This recess etching process also results in the formation of isolation structures 120X in the substrate 102. Using the methods disclosed herein, the upper surface 120S of the layer of insulating material 120 is substantially even, thereby avoiding the formation of fins 118 with an asymmetric profile, as discussed in the background section of this application.

At this point in the process, simplistically depicted gate structures 130 may be formed for the various FinFET devices used in the product 100 using either gate-first or gate-last manufacturing techniques. The gate structures will comprise a gate insulation material and a gate electrode positioned around the exposed portions of the fins 118 above the layer of insulating material 120. The materials of the gate structures may be different for NFET and PFET devices.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
   forming a first patterned masking layer comprised of a plurality of first features above a semiconductor substrate;
   forming a second patterned masking layer above said first patterned masking layer, said second patterned masking layer having an opening that exposes at least one, but not all, of said first features of said first patterned masking layer;
   performing at least one first etching process through said second patterned masking layer to remove said exposed at least one first feature and to form an initial isolation trench in said semiconductor substrate, said at least one first etching process defining a modified first patterned mask layer;
   removing said second patterned mask layer from above said modified first patterned mask layer; and
   after forming said initial isolation trench, performing at least one second etching process through said modified first patterned mask layer to thereby define a plurality of fin-formation trenches in said semiconductor substrate and to extend a depth of said initial isolation trench so as to define a final isolation trench having a final depth that is greater than a depth of said fin-formation trenches, said fin-formation trenches defining a plurality of fins.

2. The method of claim 1, further comprising:
   over-filling said fin-formation trenches and said final isolation trench with a layer of insulating material;
   performing a single CMP process to planarize an upper surface of said layer of insulating material; and
   performing a recess etching process on said layer of insulating material to reveal a final desired height of said plurality of fins and to form a final isolation structure in said final isolation trench.

3. The method of claim 1, wherein forming said first patterned masking layer comprises forming said first patterned masking layer above a first material layer that is formed between said patterned masking layer and said semiconductor substrate, and wherein, prior to performing said at least one etching process, the method comprises performing an etching process through said first patterned masking layer to pattern said first material layer while stopping on a second material layer that is formed between said first material layer and said semiconductor substrate.

4. The method of claim 1, wherein said first patterned masking layer is comprised of multiple layers of material.

5. The method of claim 1, wherein said second patterned masking layer is comprised of multiple layers of material.

6. The method of claim 1 wherein a depth of said initial isolation trench is less than said depth of said fin-formation trenches.

7. The method of claim 2, wherein said layer of insulating material is a flowable silicon dioxide material.

8. The method of claim 3, wherein said first material layer comprises silicon nitride and said second material layer comprises silicon dioxide.

9. A method, comprising:
forming a first patterned masking layer comprised of a plurality of first features above a semiconductor substrate;
removing at least one, but not all, of said first features of said first patterned masking layer so as to define a modified first patterned masking layer, wherein said at least one removed first feature is removed from above a location where a final isolation structure will be formed in said semiconductor substrate;
performing at least one first etching process through said modified first patterned masking layer to form an initial isolation trench in said semiconductor substrate; and
after forming said initial isolation trench, performing at least one second etching process through said modified first patterned masking layer to thereby define a plurality of fin-formation trenches in said semiconductor substrate and to extend a depth of said initial isolation trench so as to define a final isolation trench for said final isolation structure, said final isolation trench having a final depth that is greater than a depth of said fin-formation trenches, said fin-formation trenches defining a plurality of fins.

10. The method of claim 9, further comprising:
over-filling said fin-formation trenches and said final isolation trench with a layer of insulating material;
performing a single CMP process to planarize an upper surface of said layer of insulating material; and
performing a recess etching process on said layer of insulating material to reveal a final desired height of said plurality of fins and to form said final isolation structure in said final isolation trench.

11. The method of claim 9, wherein forming said first patterned masking layer comprises forming said first patterned masking layer above a pad nitride layer that is formed between said patterned masking layer and said semiconductor substrate, and wherein, prior to performing said at least one etching process, the method comprises performing an etching process through said first patterned masking layer to pattern said pad nitride layer while stopping on a pad oxide layer that is formed between said pad nitride layer and said semiconductor substrate.

12. The method of claim 9, wherein said first patterned masking layer is comprised of multiple layers of material.

13. The method of claim 9 wherein a depth of said initial isolation trench is less than said depth of said fin-formation trenches.

14. The method of claim 10, wherein said layer of insulating material is a flowable silicon dioxide material.

15. A method, comprising:
forming a pad oxide layer on a semiconductor substrate;
forming a pad nitride layer on said pad oxide layer;
forming a first patterned masking layer comprised of a plurality of first features above said pad nitride layer;
performing a first etching process through said first patterned masking layer to pattern said pad nitride layer while stopping on said pad oxide layer so as to thereby define a patterned pad nitride layer that exposes portions of said pad oxide layer;
after performing said first etching process, forming a second patterned masking layer above said first patterned masking layer and said patterned pad nitride layer, said second patterned masking layer having an opening that exposes at least one, but not all, of said first features of said first patterned masking layer;
performing at least one second etching process through said second patterned masking layer to remove said exposed at least one first feature and said exposed portions of said pad oxide layer and to form an initial isolation trench in said semiconductor substrate, said at least one second etching process defining a modified first patterned mask layer;
removing said second patterned mask layer from above said modified first patterned mask layer; and
performing at least one third etching process through said modified first patterned mask layer to thereby define a plurality of fin-formation trenches in said semiconductor substrate and to extend a depth of said initial isolation trench so as to define a final isolation trench having a final depth that is greater than a depth of said fin-formation trenches, said fin-formation trenches defining a plurality of fins.

16. The method of claim 15, further comprising:
over-filling said fin-formation trenches and said final isolation trench with a layer of insulating material;
performing a single CMP process to planarize an upper surface of said layer of insulating material; and
performing a recess etching process on said layer of insulating material to reveal a final desired height of said plurality of fins and to form a final isolation structure in said final isolation trench.

17. The method of claim 15, wherein said first patterned masking layer is comprised of multiple layers of material.

18. The method of claim 15, wherein said second patterned masking layer is comprised of multiple layers of material.

19. The method of claim 15, wherein a depth of said initial isolation trench is less than said depth of said fin-formation trenches.

20. The method of claim 16, wherein said layer of insulating material is a flowable silicon dioxide material.

* * * * *